(12) United States Patent
Schram et al.

(10) Patent No.: US 9,662,678 B2
(45) Date of Patent: May 30, 2017

(54) IMPRINT LITHOGRAPHY

(71) Applicant: ASML NETHERLANDS B.V., Veldhoven (NL)

(72) Inventors: Ivar Schram, Weert (NL); Johan Frederik Dijksman, Weert (NL); Sander Frederik Wuister, Eindhoven (NL); Yvonne Wendela Kruijt-Stegeman, Eindhoven (NL); Jeroen Herman Lammers, Eindhoven (NL)

(73) Assignee: ASML NETHERLANDS B.V., Veldhoven (NL)

(*) Notice: Subject to any disclaimer, the term of this patent is extended or adjusted under 35 U.S.C. 154(b) by 37 days.

(21) Appl. No.: 14/222,013

(22) Filed: Mar. 21, 2014

(65) Prior Publication Data

US 2014/0199485 A1    Jul. 17, 2014

Related U.S. Application Data

(62) Division of application No. 11/488,171, filed on Jul. 18, 2006, now Pat. No. 8,707,890.

(51) Int. Cl.
  *B44C 1/22*  (2006.01)
  *B05D 5/00*  (2006.01)
  *B82Y 10/00*  (2011.01)
  *B82Y 40/00*  (2011.01)
  *G03F 7/00*  (2006.01)

(52) U.S. Cl.
  CPC ............. *B05D 5/00* (2013.01); *B82Y 10/00* (2013.01); *B82Y 40/00* (2013.01); *G03F 7/0002* (2013.01)

(58) Field of Classification Search
  CPC .... B05D 5/00; B05D 5/04; G03F 7/00; G03F 7/0002; G03F 7/0025; G03F 7/0035
  USPC ............ 216/11, 12, 24, 27, 40, 44; 118/300, 118/313, 315
  See application file for complete search history.

(56) References Cited

U.S. PATENT DOCUMENTS

| 4,731,155 A | 3/1988 | Napoli et al. |
| 5,772,905 A | 6/1998 | Chou |

(Continued)

FOREIGN PATENT DOCUMENTS

| JP | 07-171479 | 7/1995 |
| JP | 2001-237178 | 8/2001 |

(Continued)

OTHER PUBLICATIONS

Office Action in related Japanese application No. 2007-182903 mailed Aug. 3, 2010.

*Primary Examiner* — Lan Vinh
(74) *Attorney, Agent, or Firm* — Pillsbury Winthrop Shaw Pittman LLP

(57) ABSTRACT

A method of depositing an imprintable medium onto a target area of a substrate for imprint lithography is disclosed. The method includes moving the substrate, a print head comprising a nozzle to eject an imprintable medium onto the substrate, or both, relative to the other in a first direction across the target area while ejecting a first series of droplets of imprintable medium onto the substrate and moving the substrate, the print head, or both, relative to the other in a second opposing direction across the target area while ejecting a second series of droplets of imprintable medium onto the substrate on or adjacent to droplets from the first series of droplets.

8 Claims, 12 Drawing Sheets

(56) References Cited

U.S. PATENT DOCUMENTS

| | | | |
|---|---|---|---|
| 6,409,297 B1 * | 6/2002 | Morgan et al. | 347/12 |
| 6,518,056 B2 | 2/2003 | Schembri et al. | |
| 6,846,065 B2 * | 1/2005 | Otsuki | 347/40 |
| 7,360,851 B1 | 4/2008 | Snyder | |
| 7,559,619 B2 | 7/2009 | Ready et al. | |
| 8,001,924 B2 * | 8/2011 | Dijksman et al. | 118/315 |
| 2002/0113849 A1 * | 8/2002 | Hawkins et al. | 347/77 |
| 2003/0189604 A1 | 10/2003 | Bae et al. | |
| 2004/0151978 A1 * | 8/2004 | Huang | B82Y 25/00 429/83 |
| 2005/0106321 A1 | 5/2005 | McMackin et al. | |
| 2005/0212184 A1 | 9/2005 | Filzmoser et al. | |
| 2006/0035029 A1 | 2/2006 | Xu et al. | |
| 2006/0051498 A1 * | 3/2006 | Katagami | B41J 2/2114 427/66 |
| 2006/0292291 A1 | 12/2006 | White et al. | |
| 2007/0231981 A1 | 10/2007 | Sreenivasan et al. | |
| 2007/0237886 A1 | 10/2007 | Dijksman et al. | |
| 2007/0264588 A1 | 11/2007 | Sreenivasan et al. | |

FOREIGN PATENT DOCUMENTS

| | | |
|---|---|---|
| JP | 2001-239199 | 9/2001 |
| JP | 2001-272922 | 10/2001 |
| JP | 2002-110506 | 4/2002 |
| JP | 2003-007581 | 1/2003 |
| JP | 2003-080130 | 3/2003 |
| JP | 2003-100623 | 4/2003 |
| JP | 2004-298844 | 10/2004 |
| JP | 2005-000721 | 1/2005 |
| JP | 2005-000856 | 1/2005 |
| JP | 2005-246248 | 9/2005 |
| JP | 2005-254210 | 9/2005 |
| JP | 2006-032905 | 2/2006 |
| JP | 2006-159185 | 6/2006 |
| JP | 2007-273979 | 10/2007 |
| JP | 6-339658 | 12/2010 |
| WO | 2006/023933 | 3/2006 |

* cited by examiner

IMPRINT LITHOGRAPHY

CROSS-REFERENCE TO RELATED APPLICATIONS

This application is a divisional application of U.S. patent application Ser. No. 11/488,171, filed on Jul. 18, 2006, the contents of which is incorporated herein by reference in its entirety.

FIELD

The present invention relates to imprint lithography.

BACKGROUND

A lithographic apparatus is a machine that applies a desired pattern onto a target portion of a substrate. Lithographic apparatus are conventionally used, for example, in the manufacture of integrated circuits (ICs), flat panel displays and other devices involving fine structures.

It is desirable to reduce the size of features in a lithographic pattern because this allows for a greater density of features on a given substrate area. In photolithography, the increased resolution may be achieved by using radiation of shorter wavelength. However, a significant decrease in wavelength augments concern about diffraction limits and the transparency of materials (e.g. lenses), often requiring complex and expensive constructions and materials.

An alternative for printing small features comprises transferring a pattern to a substrate by imprinting a pattern into an imprintable medium using a physical mould or template. The imprintable medium may be the substrate or a material coated on to a surface of the substrate. The imprintable medium may be functional or may be used as a "mask" to transfer a pattern to an underlying surface. The imprintable medium may for instance be provided as an imprintable material deposited on a substrate, such as a semiconductor material, to which the pattern defined by the template is to be transferred. Imprint lithography is thus essentially a moulding process on a micrometer or nanometer scale in which the topography of a template defines the pattern created on a substrate. Patterns may be layered as with optical lithography processes so that, in principle, imprint lithography could be used for such applications as IC manufacture.

Imprint lithography does not suffer from the use of very short wavelengths and resolution of the imprint pattern is believed to be primarily limited only by the resolution of the template fabrication. For instance, imprint lithography has been used to produce features in the sub-50 nm range with good resolution and line edge roughness compared to that achievable with conventional optical lithography processes.

In various imprint lithography processes, a layer of an imprintable medium is coated onto the substrate. For example, the imprintable medium may be spin coated onto the substrate. However, by using spin coating, it may be difficult to adjust the amount of imprintable material for the template pattern. For instance, it may be desirable to provide more imprintable medium in areas where the template pattern has a relatively low volume of protrusions and less imprintable material where the template pattern has a relatively high level of protrusions. Additionally, if a large area of the substrate is covered with the spin coating, the chance of a part of the imprintable medium curing at a different rate to another part may be increased. For example, in imprint lithography processes where UV radiation is used to cure the imprintable medium, spurious UV radiation may cause the imprintable medium to become cured before a pattern has been imprinted into it. A proposed solution is the use of printing (e.g. ink-jet printing, bubble jet printing, etc., or any printing method which can eject droplets of fluid) to deposit the imprintable medium (or any layer which is to be deposited) onto the substrate. By using (for example) ink-jet printing techniques, small droplets of imprintable medium can be used to cover the area of a substrate to which a pattern is to be imprinted and the number of droplets in a particular area can be adjusted to the amount of imprintable material desired in a particular area.

SUMMARY

A concern associated with printing techniques is that the imprintable material is not deposited at once on the entire area to be imprinted, but rather a scanning movement is typically used to deposit the imprintable material. As such, not all droplets within an imprintable area have resided similar times on the imprintable area. Due to this time difference, one or more components within certain droplets in the imprintable area have had more time to evaporate than other droplets in the imprintable area.

This difference in evaporation time may affect the volume (and therefore the thickness) and fluidic behavior (e.g. viscosity and surface tension) of the imprintable medium, both of which are generally relevant properties of the imprintable medium during the patterning stage of imprint lithography. Additionally or alternatively, evaporation may affect the concentration of one or more components in the composition, for example the concentration of silicon. Such a change in composition may result in a change in the physical properties of the imprintable medium.

It is, therefore, desirable to provide an improved imprint lithography method and apparatus that may overcome, or mitigate, one or more of the above or other disadvantages.

According to a first aspect of the present invention, there is provided a method of depositing an imprintable medium onto a target area of a substrate for imprint lithography, the method comprising:

moving the substrate, a print head comprising a nozzle to eject an imprintable medium onto the substrate, or both, relative to the other in a first direction across the target area while ejecting a first series of droplets of imprintable medium onto the substrate; and moving the substrate, the print head, or both, relative to the other in a second opposing direction across the target area while ejecting a second series of droplets of imprintable medium onto the substrate on or adjacent to droplets from the first series of droplets.

According to a second aspect of the present invention, there is provided a fluid dispenser to eject fluid onto an area of a lithographic substrate, the dispenser comprising:

a substrate table configured to hold a lithographic substrate; and a print head comprising a nozzle arranged to eject an imprintable material onto the lithographic substrate, wherein the print head, the substrate table, or both, are arranged to be moveable relative to the other in first and second opposed directions and the print head is arranged to eject droplets of imprintable material onto the substrate along both the first and second directions.

According to a third aspect of the present invention, there is provided a method of depositing an imprintable material onto a target area of a substrate, the method comprising:

moving the substrate, a print head comprising a nozzle to eject imprintable material onto the substrate, or both, relative to the other such that a location of the print head relative to the target area moves from a first side of the target area to a second side of the target area, while the print head ejects a series of droplets of imprintable material onto the substrate; and decreasing a volume of the droplets being ejected as the location of the print head relative to the target area moves from the first side of the target area to the second side of the target area.

According to a fourth aspect of the present invention there is provided an imprint lithography method comprising:

moving the substrate, a first print head comprising a nozzle to eject imprintable material onto the substrate, or both, relative to the other while ejecting a first series of droplets of imprintable material onto a target area;

moving the substrate, a second print head comprising a nozzle to eject imprintable material onto the substrate, or both, relative to the other while ejecting a second series of droplets onto the target area on or adjacent to droplets from the first series; and varying a volume of the individual droplets being ejected in the second series.

According to a fifth aspect of the present invention, there is provided a fluid dispenser to eject fluid onto a target area of a lithographic substrate, the dispenser comprising:

a substrate table configured to hold a lithographic substrate;

a first print head comprising a nozzle arranged to eject liquid onto the target area; and a second print head comprising a nozzle arranged to eject liquid onto the target area and arranged to deposit liquid in variable volume droplets.

According to a sixth aspect of the present invention, there is provided a method of preventing evaporation of a liquid imprintable medium during imprint lithography comprising providing an additive to the liquid imprintable medium having a higher vapor pressure than the components of the liquid imprintable medium.

According to a seventh aspect of the present invention, there is provided a liquid imprintable medium for imprint lithography comprising an acrylate monomer and an additive having a higher vapor pressure than the acrylate monomer.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

There are two principal approaches to imprint lithography which will be termed generally as hot imprint lithography and UV imprint lithography. There is also a third type of imprint lithography which may be referred to as "printing" lithography. Examples of these are illustrated in FIGS. 1a to 1c.

Figure 1A:
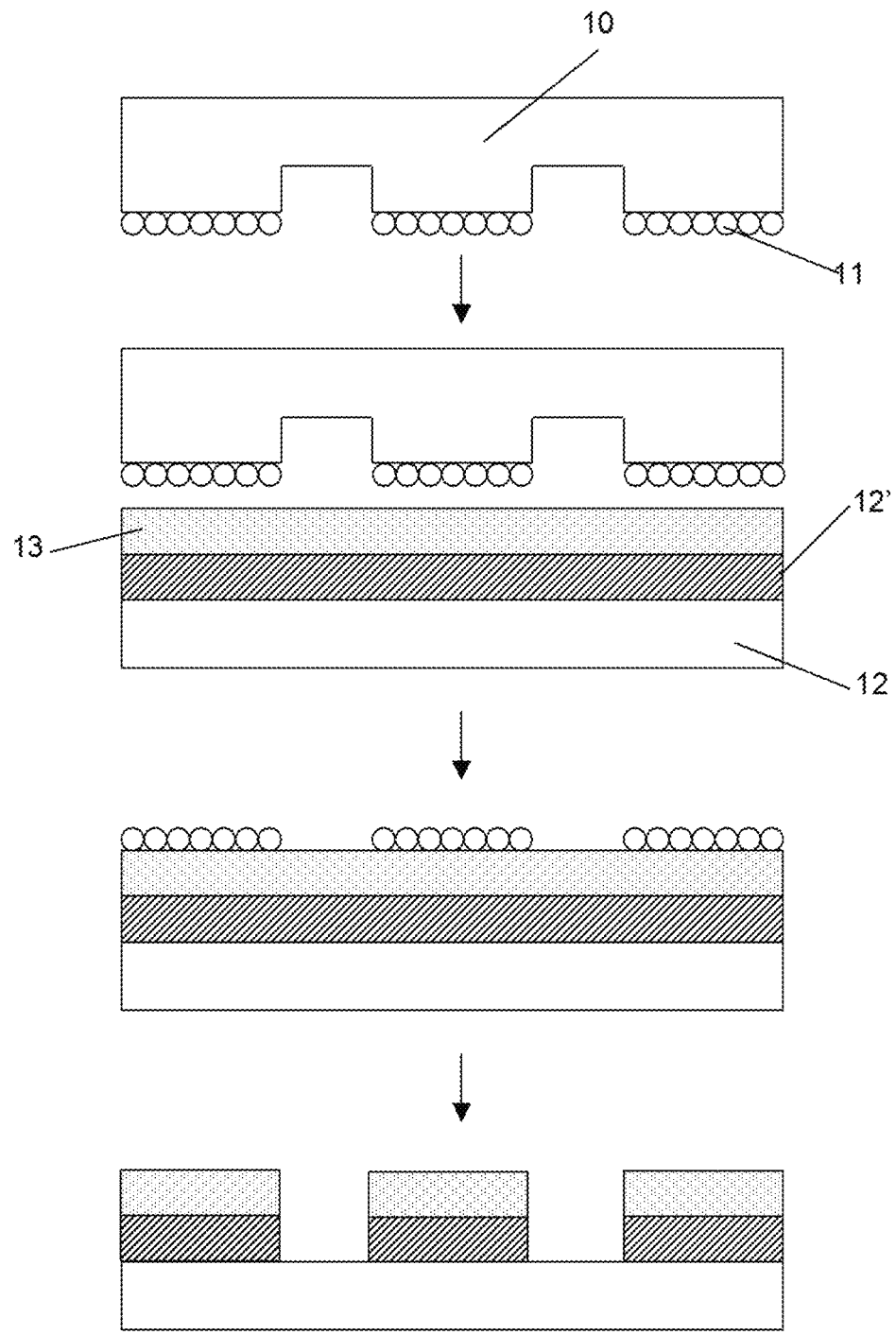
FIGS. 1a-1c illustrate examples of conventional 'printing', hot and UV lithography processes respectively.
Figure 1B:
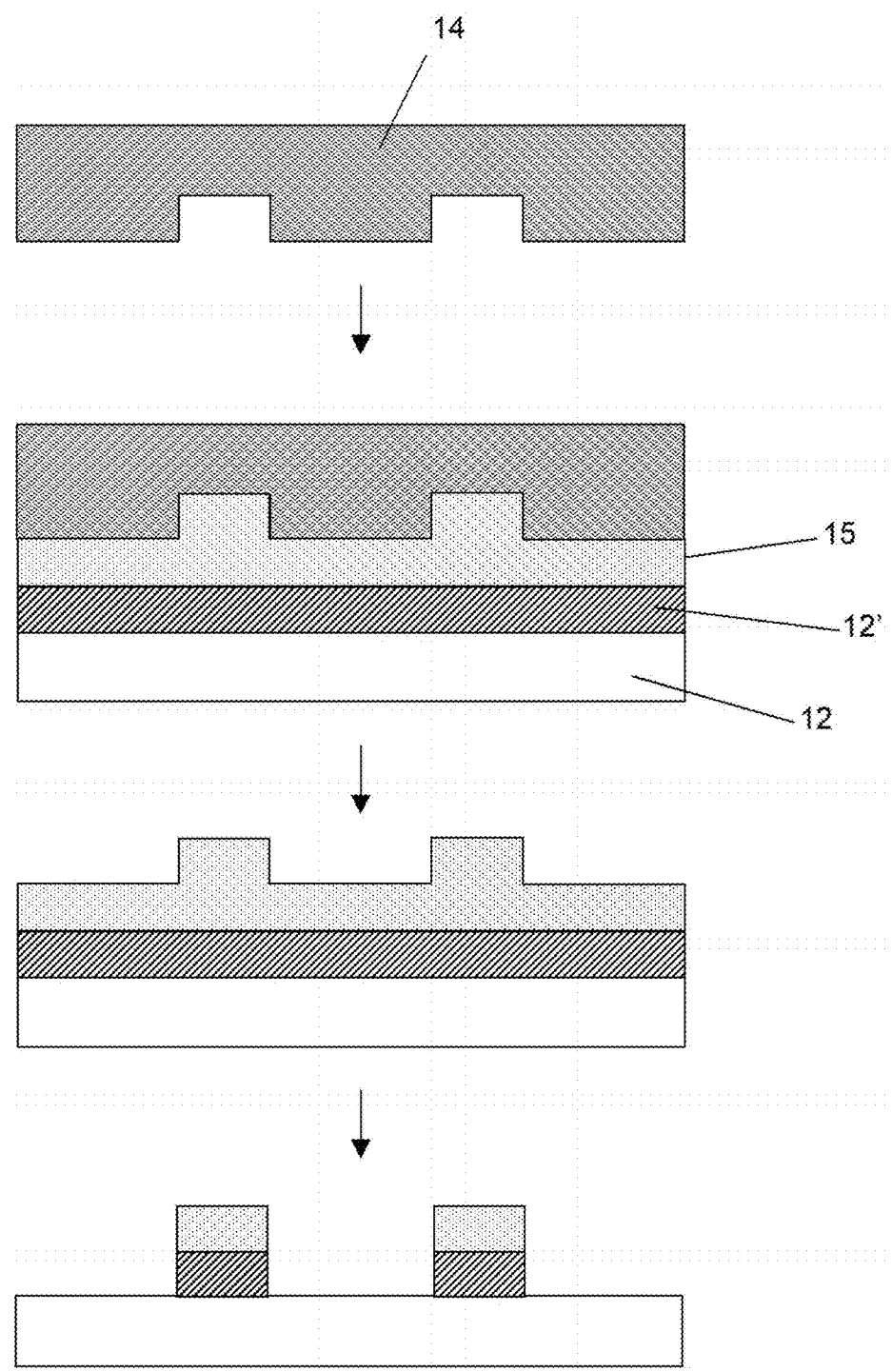
Figure 1C:
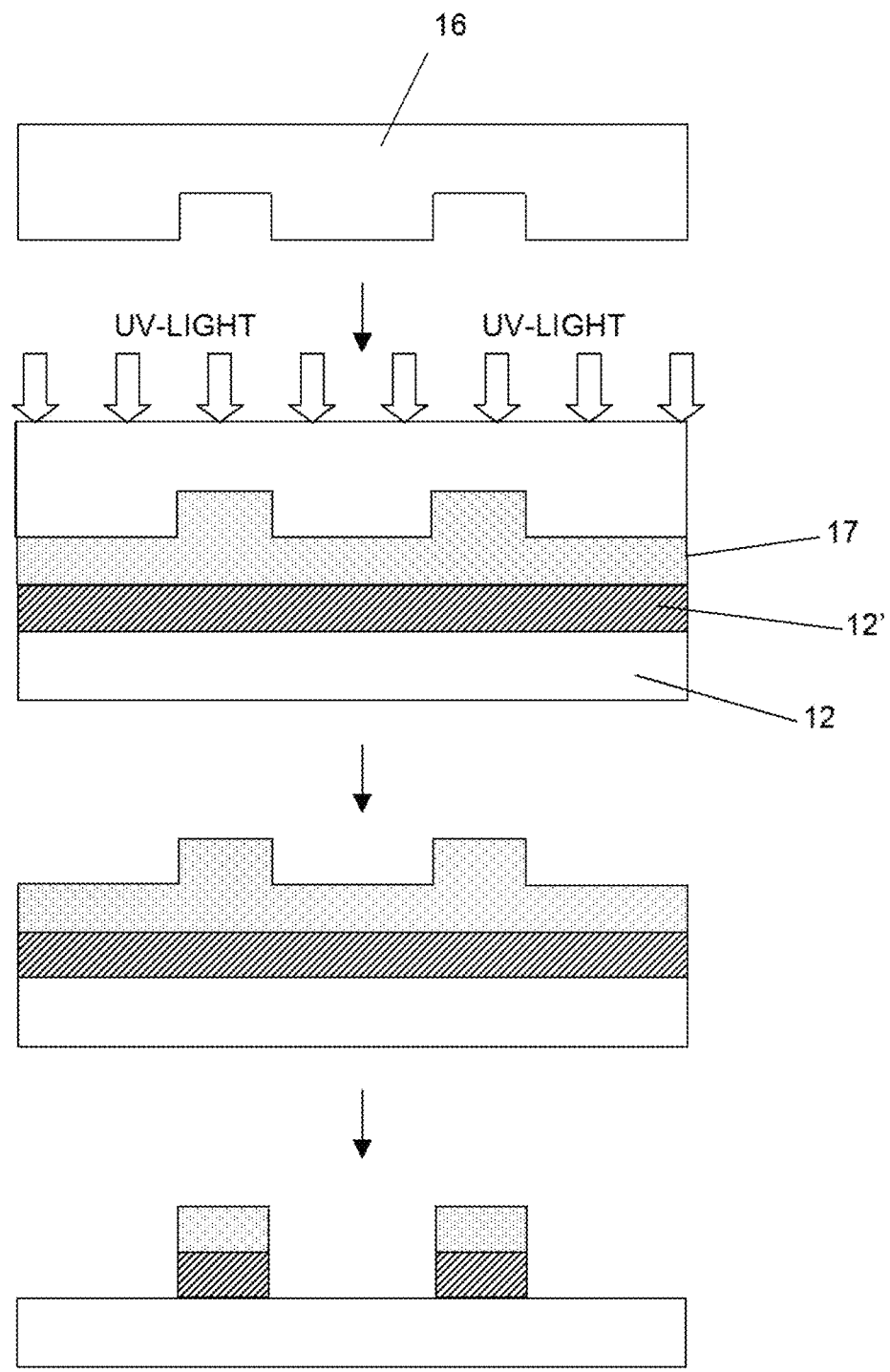

FIG. 1a schematically depicts a printing lithography process, also known as micro-contact printing, which involves transferring a layer of molecules 11 (typically an ink such as a thiol) from a flexible template 10 (typically fabricated from polydimethylsiloxane (PDMS)) onto an imprintable material layer 13 which is supported upon a substrate 12 and planarization and transfer layer 12'. The template 10 has a pattern of features on its surface, the molecular layer being disposed upon the features. When the template is pressed against the imprintable material layer the layer of molecules 11 stick to the imprintable material. Upon removal of the template from the imprintable material the layer of molecules 11 stick to the imprintable material. The residual layer of imprintable material is etched such that the areas of the imprintable material not covered by the transferred molecular layer are etched down to the substrate.

Hot imprint lithography (or hot embossing) is also known as nanoimprint lithography (NIL) when used on a nanometer scale. The process uses a harder template made from, for example, silicon or nickel, which are more resistant to wear and deformation. This is described for instance in U.S. Pat. Nos. 4,731,155 and 5,772,905, and illustrated in FIG. 1b. In a typical hot imprint process a solid template 14 is imprinted into a thermosetting or a thermoplastic polymer resin 15, which has been cast on the surface of a substrate 12. The resin may for instance be spin coated and baked onto the substrate surface or more typically (as in the example illustrated) onto a planarization and transfer layer 12'. It should be understood that the term "hard" when describing an imprint template includes materials which may generally be considered between "hard" and "soft" materials, such as for example "hard" rubber. The suitability of a particular material for use as an imprint template is determined by its application requirements.

When a thermosetting polymer resin is used the resin is heated to a temperature such that, upon contact with the template, the resin is sufficiently flowable to flow into the pattern features defined on the template. The temperature of the resin is then increased to thermally cure (e.g. crosslink) the resin so that it solidifies and irreversibly adopts the desired pattern. The template may then be removed and the patterned resin cooled.

Examples of thermoplastic polymer resins used in hot imprint lithography processes are poly (methyl methacrylate), polystyrene, poly (benzyl methacrylate) or poly (cyclohexyl methacrylate). The thermoplastic resin is heated so that it is in a freely flowable state immediately prior to imprinting with the template. It is typically necessary to heat thermoplastic resin to a temperature considerably above the glass transition temperature of the resin. The template is pressed into the flowable resin and sufficient pressure is applied to ensure the resin flows into all the pattern features defined on the template. The resin is then cooled to below its glass transition temperature with the template in place whereupon the resin irreversibly adopts the desired pattern. The pattern will consist of the features in relief from a residual layer of the resin which may then be removed by an appropriate etch process to leave only, the pattern features.

Figure 2:
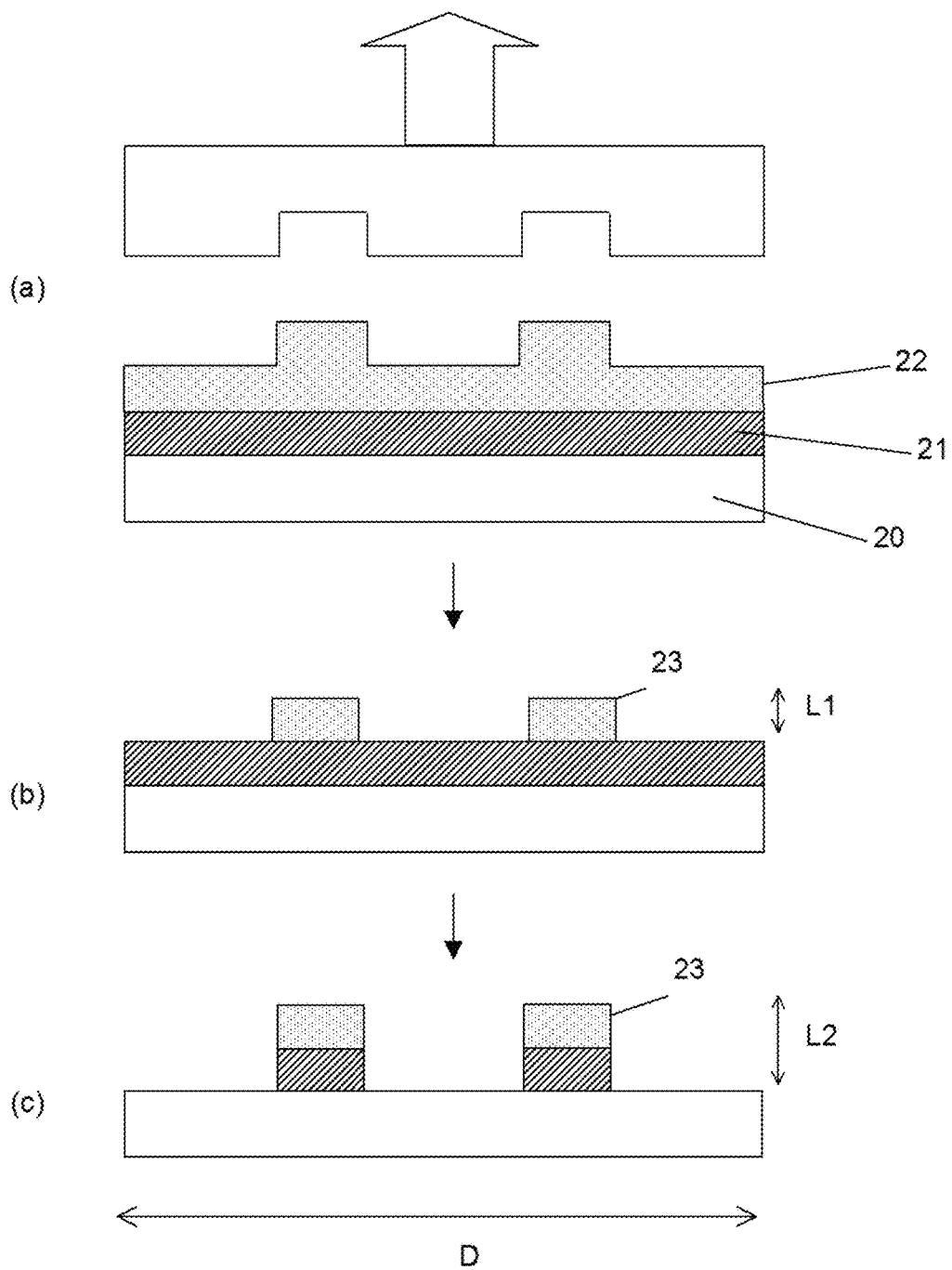
FIG. 2 illustrates a two step etching process employed when hot and UV imprint lithography is used to pattern an imprintable material layer.

Upon removal of the template from the solidified resin, a two-step etching process is typically performed as illustrated in FIGS. 2a to 2c. The substrate 20 has a planarization and transfer layer 21 immediately upon it, as shown in FIG. 2a. The purpose of the planarization and transfer layer is two-fold. It acts to provide a surface substantially parallel to that of the template, which helps to ensure that the contact between the template and the resin is parallel, and also to improve the aspect ratio of the printed features, as described herein.

After the template has been removed, a residual layer 22 of the solidified resin is left on the planarization and transfer layer 21, shaped in the desired pattern. The first etch removes parts of the residual layer. The first etch is preferably anisotropic. In some instances the first etch may be isotropic, resulting in a poor aspect ratio of features where L1 is the height of the features 23, as shown in FIG. 2b. The second etch, which is anisotropic (or selective), improves the aspect ratio. The anisotropic etch removes those parts of the planarization and transfer layer 21 which are not covered by the solidified resin, increasing the aspect ratio of the features 23 to (L2/D), as shown in FIG. 2c. The resulting polymer thickness contrast left on the substrate after etching can be used as for instance a mask for dry etching if the imprinted polymer is sufficiently resistant, for instance as a step in a lift-off process.

Hot imprint lithography suffers from a disadvantage in that not only is the pattern transfer performed at a higher temperature, but also relatively large temperature differentials might be required in order to ensure the resin is adequately solidified before the template is removed. Temperature differentials between 35 and 100° C. may be needed. Differential thermal expansion between, for instance, the substrate and template may then lead to distortion in the transferred pattern. The problem may be exacerbated by the relatively high pressure used for the imprinting step, due the viscous nature of the imprintable material, which can induce mechanical deformation in the substrate, again distorting the pattern.

UV imprint lithography, on the other hand, does not involve such high temperatures and temperature changes nor does it require such viscous imprintable materials. Rather, UV imprint lithography involves the use of a partially or wholly transparent template and a UV-curable liquid, typically comprising a monomer such as an acrylate or methacrylate for example. In general any photopolymerizable material could be used, such as a mixture of monomers and an initiator. The curable liquid may also, for instance, include a dimethyl siloxane derivative. Such materials tend to be much less viscous than the thermosetting and thermoplastic resins used in hot imprint lithography and consequently move faster to fill template pattern features. Low temperature and low pressure operation also favors higher throughput capabilities. Although the name 'UV imprint lithography' implies that UV radiation is always used, those skilled in the art will be aware that any suitable actinic radiation may be used (for example, visible light may be used). Hence, any reference herein to UV imprint lithography, UV radiation, or UV curable materials, etc should be interpreted as including any suitable actinic radiation, and should not be interpreted as being limited to UV radiation only.

An example of a UV imprint process is illustrated in FIG. 1c. A quartz template 16 is applied to a UV-curable resin 17 in a similar manner to the process of FIG. 1b. Instead of raising the temperature as in hot embossing employing thermosetting resins, or temperature cycling when using thermoplastic resins, UV radiation is applied to the resin through the quartz template in order to polymerize and thus cure it. Upon removal of the template, the remaining steps of etching the residual layer of imprintable material are the same or similar as for the hot embossing process described herein. The UV curable resins typically used have a much lower viscosity than typical thermoplastic resins so that lower imprint pressures may be used. Reduced physical deformation due to the lower pressures, together with reduced deformation due to high temperatures and temperature changes, makes UV imprint lithography suited to an application requiring high overlay accuracy. In addition, the transparent nature of UV imprint templates can accommodate optical alignment techniques simultaneously to the imprinting.

Although this type of imprint lithography mainly uses UV curable materials, and is thus generically referred to as UV imprint lithography, other wavelengths of radiation may be used to cure appropriately selected materials (e.g., activate a polymerization or cross linking reaction). In general, any radiation capable of initiating such a chemical reaction may be used if an appropriate imprintable material is available. Alternative "activating radiation" may, for instance, include visible light, infrared radiation, x-ray radiation and electron beam radiation. In the general description herein, references to UV imprint lithography and use of UV radiation are not intended to exclude these and other activating radiation possibilities.

As an alternative to imprint systems using a planar template which is maintained substantially parallel to the substrate surface, roller imprint systems have been developed. Both hot and UV roller imprint systems have been proposed in which the template is formed on a roller but otherwise the imprint process is very similar to imprinting using a planar template. Unless the context requires otherwise, references to an imprint template include references to a roller template.

There is a particular development of UV imprint technology known as step and flash imprint lithography (SFIL) which may be used to pattern a substrate in small steps in a similar manner to optical steppers conventionally used, for example, in IC manufacture. This involves printing small areas of the substrate at a time by imprinting a template into a UV curable resin, 'flashing' UV radiation through the template to cure the resin beneath the template, removing the template, stepping to an adjacent region of the substrate and repeating the operation. The small field size of such step and repeat processes helps to reduce or minimize pattern distortions and CD variations so that SFIL may be particularly suited to manufacture of IC and other devices requiring high overlay accuracy.

In a so-called 'drop on demand' process, the resin is dispensed onto a target portion of the substrate in droplets immediately prior to imprinting with the template. The liquid dispensing is controlled so that a certain volume of liquid is deposited on a particular target portion of the substrate. The liquid may be dispensed in a variety of patterns and the combination of carefully controlling liquid volume and placement of the pattern can be employed to confine patterning to the target area.

Dispensing the resin on demand as mentioned is not a trivial matter. The size and spacing of the droplets are carefully controlled to ensure there is sufficient resin to fill template features while at the same time minimizing excess resin which can be rolled to an undesirably thick or uneven residual layer since as soon as neighboring drops touch fluid the resin will have nowhere to flow. The problems associated with overly thick or uneven residual layer are discussed below.

Although reference is made above to depositing UV curable liquids onto a substrate, the liquids could also be deposited on the template and in general the same techniques and considerations will apply.

Figure 3:
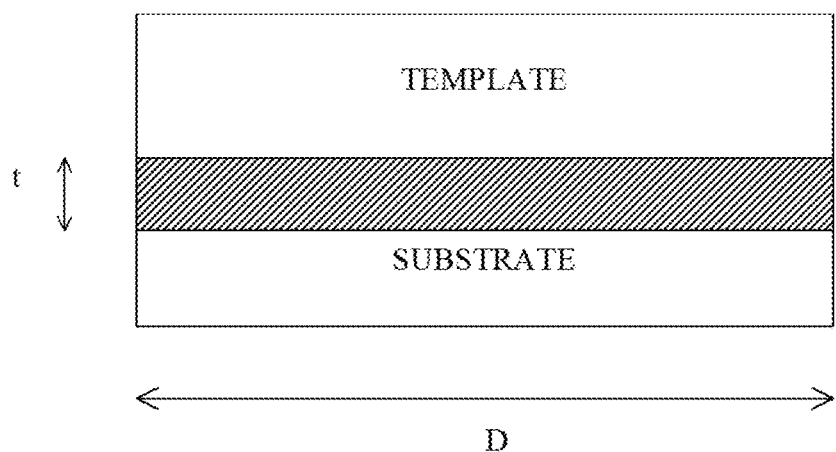
FIG. 3 schematically illustrates a template and a typical imprintable material layer deposited on a substrate.

FIG. 3 illustrates the relative dimensions of the template, imprintable material (curable monomer, thermosetting resin, thermoplastic, etc.) and substrate. The ratio of the width of the substrate, D, to the thickness of the curable resin layer, t, is of the order of $10^6$. It will be appreciated that, in order to avoid the features projecting from the template damaging the substrate, the dimension t should be greater than the depth of the projecting features on the template.

The residual layer left after stamping is useful in protecting the underlying substrate, but may also be the source of one or more problems particularly when high resolution and/or overlay accuracy is desired. The first 'breakthrough' etch is isotropic (non-selective) and will thus to some extent erode the features imprinted as well as the residual layer. This may be exacerbated if the residual layer is overly thick and/or uneven. This problem may, for instance, lead to variation in the thickness of lines ultimately formed in the underlying substrate (i.e. variation in the critical dimension). The uniformity of the thickness of a line that is etched in the transfer layer in the second anisotropic etch is dependant upon the aspect ratio and integrity of the shape of the feature left in the resin. If the residual resin layer is uneven, then the non-selective first etch can leave some of these features with "rounded" tops so that they are not sufficiently well defined to ensure good uniformity of line thickness in the second and any subsequent etch process.

In principle, the above problem may be reduced by ensuring the residual layer is as thin as possible but this can require application of undesirably large pressures (possibly increasing substrate deformation) and relatively long imprinting times (possibly reducing throughput).

The template is a significant component of the imprint lithography system. As noted herein, the resolution of the features on the template surface is a limiting factor on the attainable resolution of features printed on the substrate. The templates used for hot and UV lithography are generally formed in a two-stage process. Initially, the desired pattern is written using, for example, electron beam writing, to give a high resolution pattern in imprintable material. The imprintable material pattern is then transferred into a thin layer of chrome which forms the mask for the final, anisotropic etch step to transfer the pattern into the base material of the template. Other techniques such as for example ion-beam lithography, X-ray lithography, extreme UV lithography, epitaxial growth, thin film deposition, chemical etching, plasma etching, ion etching or ion milling could be used. Generally, a technique capable of very high resolution will be used as the template is effectively a 1× mask with the resolution of the transferred pattern being limited by the resolution of the pattern on the template.

The release characteristics of the template may also be a consideration. The template may, for instance, be treated with a surface treatment material to form a thin release layer on the template having a low surface energy (a thin release layer may also be deposited on the substrate).

Another consideration in the development of imprint lithography is the mechanical durability of the template. The template may be subjected to large forces during stamping of the imprintable material, and in the case of hot lithography, may also be subjected to extremes of pressure and temperature. This may cause wearing of the template, and may adversely affect the shape of the pattern imprinted upon the substrate.

In hot imprint lithography, there is a potential advantage in using a template of the same or similar material to the substrate to be patterned in order to reduce or minimize differential thermal expansion between the two. In UV imprint lithography, the template is at least partially transparent to the activation radiation and often quartz templates are used. Although specific reference may be made in this text to the use of imprint lithography in the manufacture of ICs, it should be understood that imprint apparatus and methods described may have other applications, such as the manufacture of integrated optical systems, guidance and detection patterns for magnetic domain memories, hard disc magnetic media, flat panel displays, thin-film magnetic heads, etc.

While in the description herein, particular reference has been made to the use of imprint lithography to transfer a template pattern to a substrate via an imprintable material effectively acting as a resist, in some circumstances the imprintable material may itself be a functional material, for instance having a functionally such as conductivity, optical linear or non linear response, among others. For example, the functional material may form a conductive layer, a semi-conductive layer, a dielectric layer or a layer having another desirable mechanical, electrical or optical property. Some organic substances may also be appropriate functional materials. Such applications may be within the scope of an embodiment of the present invention.

As mentioned above, evaporation of the imprintable medium after printing may be undesirable for one or more reasons. Such evaporation may, for example, occur during an interval between printing and curing of the medium (for example, within the process it may take some time for the substrate to pass from the printing station to the imprint station).

The imprintable medium deposited onto the substrate may, for example, comprise a monomer, a silicon-containing monomer, a cross linker and a photo-initiator. The composition of the imprintable medium should be optimal at the start of the imprint process (i.e. after a period of evaporation). Thus, in one or more embodiments of the invention the imprintable medium deposited onto the substrate further comprises an additive, which is intended to evaporate from the composition prior to imprinting. By selecting a highly volatile compound as the additive, the additive may act as a buffer to the evaporation of one or more other compounds in the imprintable medium (the additive may, therefore be referred to as an "evaporation buffer"). For example the additive will evaporate from the composition in place of one or more other components (the additive may, for example, be described as sacrificially evaporating from the imprintable medium). In the context of an embodiment of the invention it should be appreciated that "highly volatile" is intended to mean that the additive has a higher rate of evaporation than the most volatile compound normally present in the imprintable medium.

The vapor pressure of a compound may be used as an indicator of the volatility of a compound. Accordingly, the additive may be chosen to have a higher vapor pressure than that of the most volatile compound in the imprintable medium so as to ensure that the additive will generally evaporate from the liquid before any other compound in the imprintable medium. In a typical liquid imprintable medium the most volatile compound may, for example, comprise an acrylate monomer (for example Iso-butyl acrylate, Butyl acrylate or 2-Ethyl butyl acrylate). An alcohol (i.e. a compound having one or more hydroxyl compounds) or an ether (i.e. a compound having two hydrocarbon groups linked by an oxygen atom) may, for example, be a suitable additive. For example, methanol, ethanol or ether may have suitably high vapor pressures. Table 1 gives the vapor pressures of these example compounds and that of acrylate monomers. The vapor pressure of the additive may, for example, be between approximately 6 and 256 times that of the acrylate monomer. For example the vapor pressure of the additive may be between approximately 5 and 60 kPa.

TABLE 1

Vapor pressures for illustrative acrylate monomers (examples) and additives (examples) at room temperature

| Acrylate monomers | | Evaporation buffers | |
|---|---|---|---|
| Chemical name | Vapor pressure | Chemical name | Vapor pressure |
| Iso-butyl acrylate | 0.88 kPa | Methanol | 12.3 kPa |
| Butyl acrylate | 0.43 kPa | Ethanol | 5.85 kPa |
| 2-Ethyl butyl acrylate | 0.23 kPa | Ether | 58.9 kPa |

The additive may be selected to be chemically stable (for example, it may be a compound which will not react with one or more compounds within the imprintable medium and/or it may be a compound which will not cause contamination of the gas (e.g., air) following evaporation). The additive may be selected to be non-UV absorbing, such that any additive remaining in the imprintable medium will not affect the imprint process. The additive may be completely miscible with the liquid imprintable medium (for example, the additive may comprise a solvent).

The particular choice of chemical compound for use as an additive and the relative volume of additive required may vary depending upon a variety of factors. For example, the physical and chemical properties of imprintable medium should be considered (for example the vapor pressure of the most volatile compound used). Furthermore, the particular imprint lithography process being used may be considered when choosing the additive, for example the time between droplet deposition and imprinting.

Inclusion of excessive additive in the imprintable medium may be undesirable, for example throughput of the process may be hampered. Accordingly, the volume and type of additive chosen may, for example, be chosen such that the additive is substantially completely evaporated from the liquid imprintable medium just before imprinting. After imprinting and illumination of the imprintable medium with UV radiation, it may be desirable to include a further evaporation step in the process to collect evaporated gasses.

Table 2 shows the viscosities of example additives. As the viscosity of the imprintable medium may be, for example, in the range 1-5 mPa·s, the viscosity of the additive may be lower than the viscosity of the imprintable medium prior to the introduction of the additive (for example, up to 5 times lower). Thus, the addition of the additive for evaporation may provide an advantageous effect of reducing the viscosity of the liquid imprintable medium. A lower viscosity may, for example, be advantageous when depositing the imprintable medium (for example, by ink-jet printing).

TABLE 2

Viscosity of additives (examples) at room temperature
Evaporation buffers

| Chemical name | Viscosity |
|---|---|
| Methanol | 0.59 mPa · s |
| Ethanol | 0.23 mPa · s |
| Ether | 0.17 mPa · s |

Figure 4A:
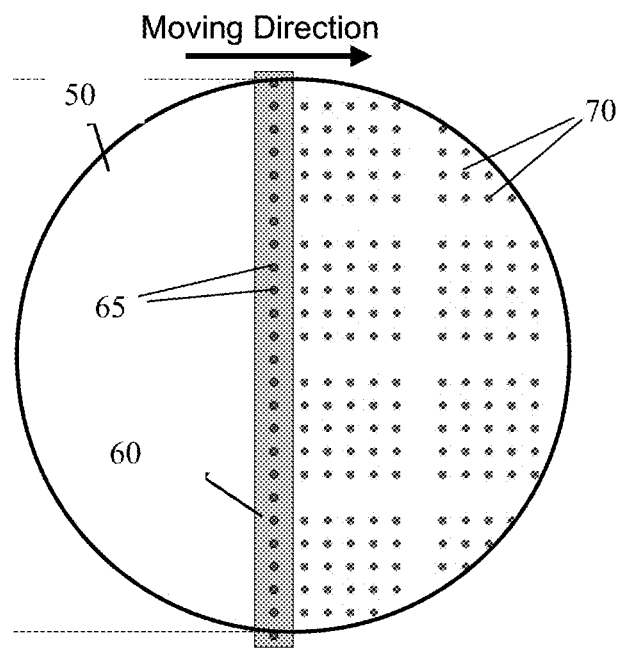
FIGS. 4a and 4b schematically illustrate the printing of an imprintable medium on a substrate.
Figure 4B:
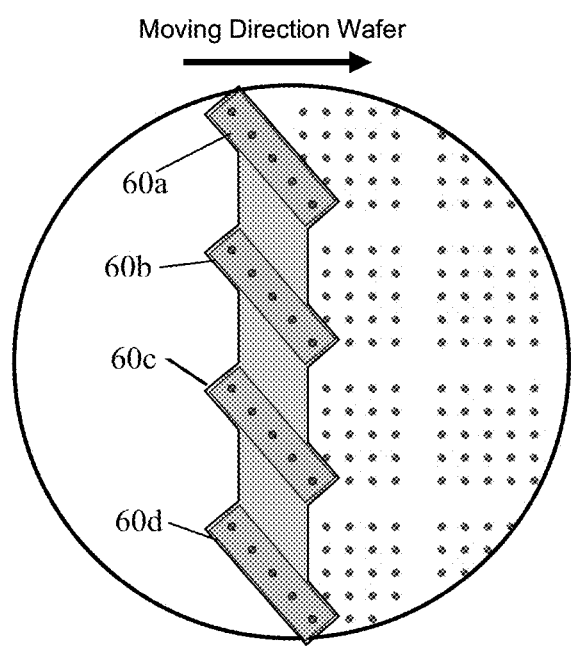

FIGS. 4a and 4b schematically depict a fluid dispenser to eject imprintable medium onto an area of a lithographic substrate 50. The dispenser will typically comprise a substrate support (for example, a substrate table (not shown)) to hold the substrate 50. The dispenser further comprises at least one print head 60, which comprises at least one nozzle 65 to eject imprintable medium. The print head and nozzle arrangement may be of any known printer arrangement which is suitable to eject droplets of fluid, for example the print head may be an ink-jet or bubble jet arrangement.

As shown in FIG. 4a, the dispenser may comprise a single print head 60. Alternatively, as shown in FIG. 4b, the dispenser may comprise a plurality of individual print heads 60a-d.

The print head(s) may, for example, extend over a distance substantially equal to or greater than the width (e.g., diameter) of the substrate 50. Such an arrangement enables the print head(s) 60 to deposit droplets of imprintable medium across the full width of the substrate 50 and thereby to decrease the time taken for depositing the imprintable medium. In an arrangement in which the print head(s) 60 extends across substantially the entire width of the substrate 50 the print head(s) may, for example, be provided with a plurality of nozzles 65 at spaced apart locations along the print head(s) 60 to enable a distributed array of droplets to be printed onto the substrate.

It will, however, be appreciated that the invention is not limited to arrangements in which the print head, or plurality of print heads, 60 extend across the full width of the substrate. For example, an embodiment may utilize an arrangement in which the print head, or plurality of print heads, only extends over a portion of the substrate (but may, for example, be moved across the entire substrate as required).

The print head(s) 60 and/or the substrate table (and therefore the substrate 50) are arranged to be moveable relative to the other. For example the print head(s) 60 may be fixed and the substrate table moveable. Alternatively, the substrate table may remain stationary and the print head(s) 60 may be arranged to move across the substrate 50. Or, both the print head(s) 60 and the substrate table may be moveable relative to one another. Thus, for example, the print head(s) 60 may move across (or scan) the substrate 50 while ejecting droplets of fluid from the nozzles 65 so as to deposit a pattern of droplets 70 of imprintable medium onto the substrate 50. Accordingly, in the description herein, any references to movement of the print head(s) with respect to the substrate are not intended to be limiting, for example by excluding the use of a stationary print head(s) 60 with a moveable substrate table (or substrate 50).

As mentioned above, the size and spacing of the droplets 70 should be carefully controlled in order to provide the desired uniform layer of imprintable medium (for example once the individual droplets have coalesced). The size of the droplets may be relatively small, for example the individual droplets may be less than 50 pL (picolitres) in size.

The uniform nature of the imprintable medium may be adversely affected by evaporation of the droplets 70 between their deposition on the substrate 50 and imprinting with a template. While the addition of an evaporation buffer to the imprintable medium, as described above, may be utilized to optimize the composition at the imprint stage, further problems may still be encountered, for example due to uneven evaporation of the imprintable medium.

Figure 5:
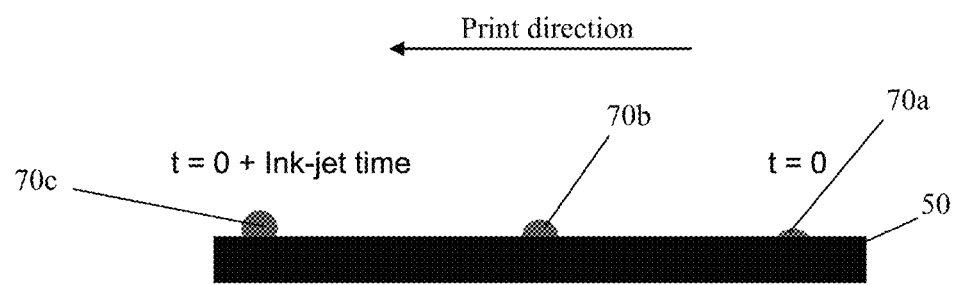
FIG. 5 represents the evaporation of droplets of imprintable medium during the printing process.

In particular, the print head(s) 60 take time to scan across the width of the target area of the substrate when depositing droplets 70, which may lead to uneven evaporation of the droplets. This effect is illustrated schematically in FIG. 5. Droplets 70a, 70b and 70c have been sequentially deposited on the substrate 50 as the print head (not shown) moves across the substrate (from right to left). The first droplet 70a is deposited at the start of the print process (i.e. at "t=0"). The final droplet 70c is printed later than droplet 70a by a time equal to the required printing time for the substrate 50 (i.e. at "t=0+ink-jet time"). Accordingly first droplet 70a has been on the substrate 50 for a time period equal to the printing time longer than final droplet 70c and as such it has a smaller volume than final droplet 70c due to evaporation. Intermediate droplet 70b has also evaporated and its volume should be between that of droplet first droplet 70a and final droplet 70c since it has had half the time period of first droplet 70a to evaporate.

Figure 6A:
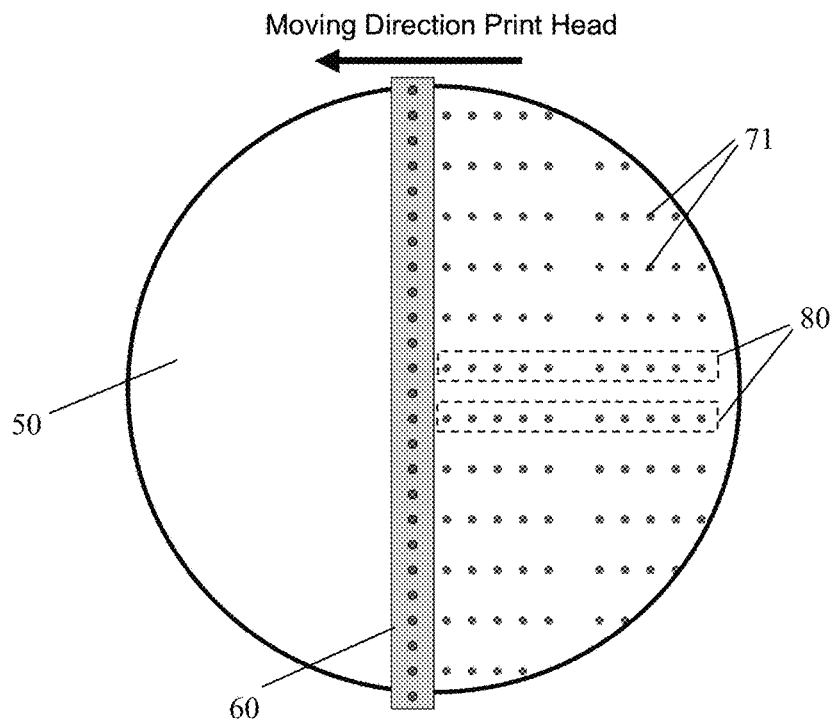
FIGS. 6a and 6b schematically illustrate the printing of an imprintable medium on a substrate in accordance with an embodiment of the invention.
Figure 6B:
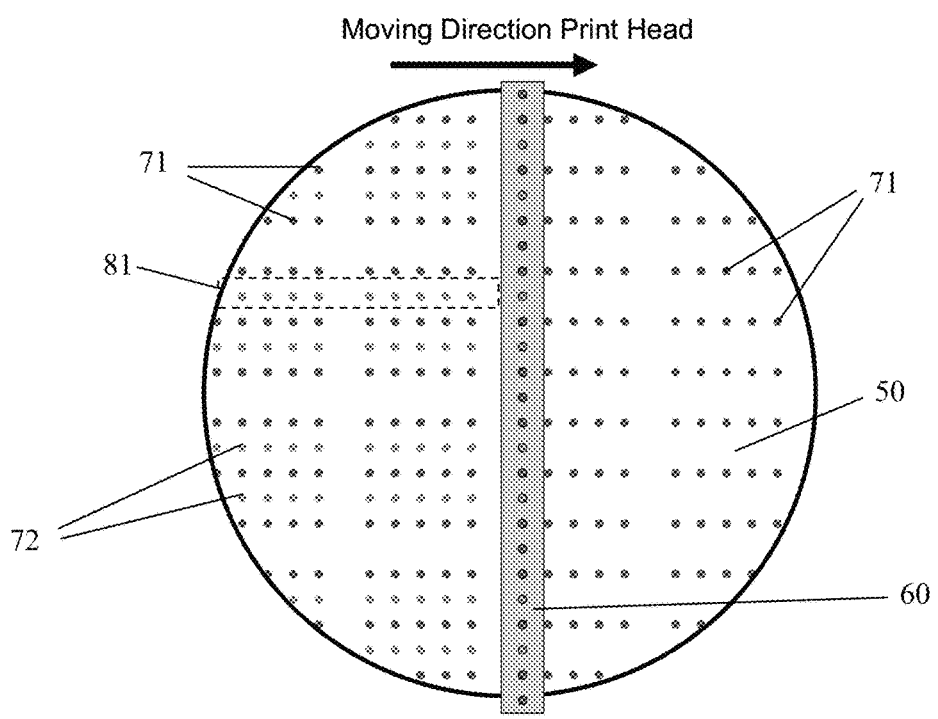

FIGS. 6a and 6b illustrate an embodiment of the present invention. As shown in FIG. 6a, the print head(s) 60 is moved across the width of the substrate 50 (or across a target area of the substrate which is to be printed) in a first direction (for example, from right to left in FIG. 6) while ejecting a first series of droplets 71. The droplets 71 deposited in the first movement of the print head form substantially half of the final pattern. The droplets 71 may, for example, be printed in a number of spaced apart rows 80 (i.e. having a spacing sufficient for a further droplet to be deposited therebetween) of droplets extending substantially parallel to the direction of travel of the print head. As shown in FIG. 6a the droplets may be printed in a normal spacing (i.e. a spacing in which the drops will be able to coalesce and provide a uniform covering) along the length of each of the rows 80.

As shown in FIG. 6b, the print head(s) 60 is subsequently moved across the width of the substrate 50 in a direction opposite to the first direction (for example, from left to right in FIG. 6) while ejecting a second series of droplets 72. The droplets 72 deposited in the second movement of the print head(s) 60 form substantially half of the final pattern. Each droplet 72 deposited in the second movement is adjacent to a droplet 71 from the first movement. The droplets 72 may be printed in a series of rows 81. For example, the rows may be substantially parallel to the rows 80 of the first droplets. Thus, the droplets may, for example, be arranged on the substrate in a series of rows of first 71 and second 72 series of droplets (the rows extending in a direction generally parallel to the movement of the print head(s) and alternating between rows of first and second series droplets in the direction generally perpendicular to the movement of the print head(s)).

Figure 7:
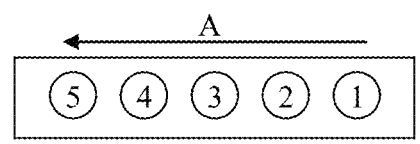
FIGS. 7a and 7b illustrate the order of printing of a plurality of droplets in accordance with an embodiment of the invention.
Figure 7B:
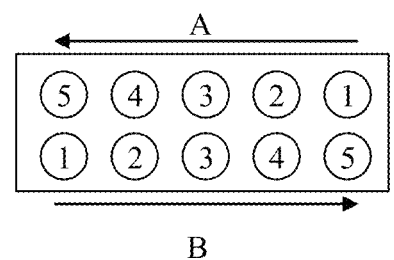

FIGS. 7a and 7b provide an example of the print order of a region of droplets when using a single movement of the print head (FIG. 7a) and two opposing movements of the print head (FIG. 7b). As shown in FIG. 7a, the order of the droplets deposition onto the substrate in the prior arrangement is such that the left hand side of the print region will have more time to evaporate more than the right hand side of the region. However as shown in FIG. 7b, when printing adjacent droplets in opposing motions of the print head(s) (as indicated by arrows A and B) the later deposited droplets are each deposited adjacent to an earlier deposited droplet (i.e., a droplet in the same column in FIG. 7b). Furthermore, since the rows are printed in opposite directions, the sequence of deposition of the droplets in the second row is the inverse of the sequence of the first row. Accordingly, the average time since deposition of adjacent first and second row droplets (i.e. droplets in the same columns in FIG. 7b) can be substantially evenly distributed across the width of the substrate. In practice adjacent droplets may coalesce after printing which may further enhance the levelling of the time distribution when printing in two motions.

In order to improve or optimize the averaging effect of the two-motion printing, the movement in the first and second directions may, for example, be at substantially the same speed. This should ensure that the time difference between the earlier and later printed droplets in each motion would be consistent (since the distance moved across the print area is substantially constant).

Figure 8A:
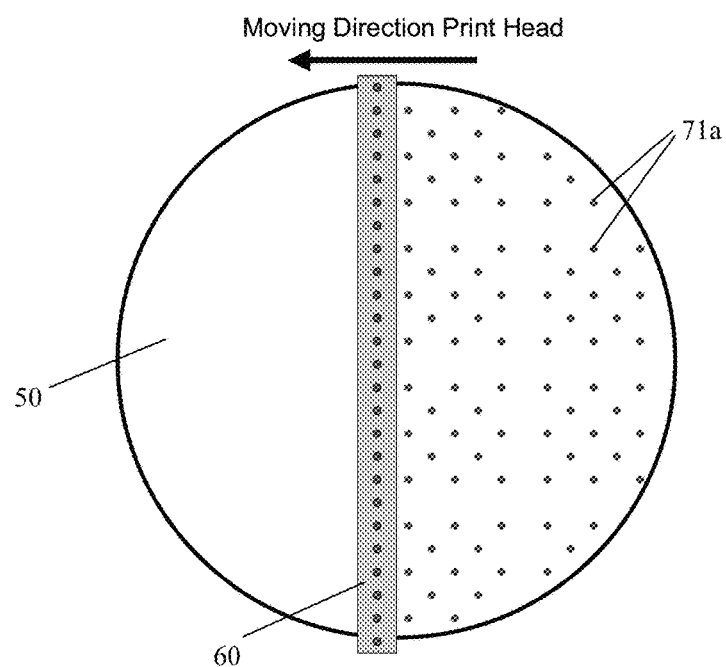
FIGS. 8a and 8b schematically illustrate the printing of an imprintable medium on a substrate in accordance with an embodiment of the invention.
Figure 8B:
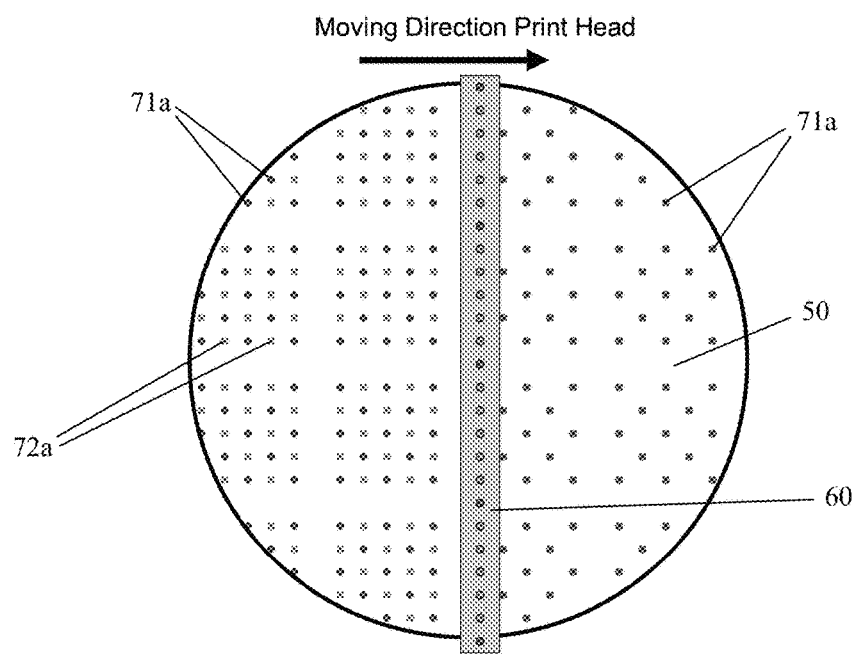

FIGS. 8a and 8b illustrate an alternate pattern for depositing the first 71a and second 72a series of droplets. In this embodiment the first droplets 71a are deposited in rows of spaced apart droplets, the rows extending substantially parallel to the direction of motion of the print head(s) 60. Adjacent rows of droplets are misaligned such that droplets of the first series 71a are also in a spaced apart distribution along a direction substantially perpendicular to the motion of the print head(s) 60. The second series droplets 72a, ejected during the reverse motion of the printhead(s) 60, are deposited between each spaced apart first series droplet 71a. Thus, in this embodiment the first 71a and second 72a series droplets are arranged on the substrate 50 in an alternating pattern in both the direction substantially parallel to and substantially perpendicular to the motion of the print head(s) 60.

The embodiments above deposit a pattern onto the substrate by positioning first 71 and second 72 series droplets adjacent to one another to provide a levelled time of printing distribution of adjacent droplets. In other embodiments the first and second motions of the print head(s) 60 could be arranged to eject droplets at coinciding locations. For example, the first motion could deposit the entire pattern onto the substrate 50 but with only half of the required volume and the second motion could deposit corresponding droplets in the same pattern with the remaining volume of imprintable medium such that the average time since printing is averaged out at each droplet location.

Figure 9:
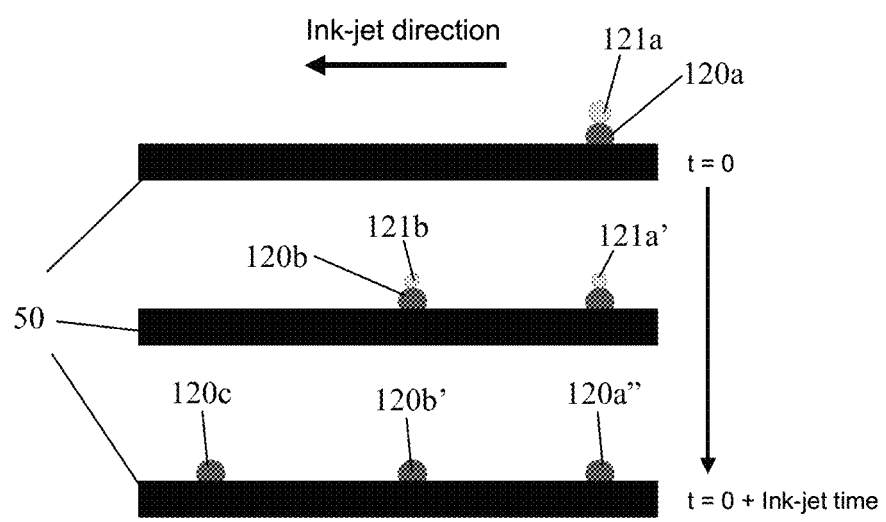
FIG. 9 represents the evaporation of droplets of imprintable medium during the printing process in accordance with an embodiment of the invention.

FIG. 9 illustrates a further embodiment of the invention in which the volume of the droplets 120 deposited onto the surface of the substrate 50 is decreased as the print head(s) are moved across the width of the print area (in the direction of arrow C).

At the start of the printing process the first droplet 120a is printed along with an additional quantity of fluid 121a to compensate for evaporation. As time progresses an intermediate droplet 120b is printed onto the substrate. At this point in time the additional quantity of fluid 121a' printed with the first location has evaporated, decreasing its volume. An additional quantity of fluid 121b is printed with the intermediate droplet 120b to compensate for evaporation of this droplet. The additional quantity of fluid 121b at the intermediate droplet 120b is substantially equal in volume to the additional quantity of fluid 121a' at the first droplet 120a at the time that the intermediate droplet is 120b is deposited. As the final droplet 120c is deposited (at "t=0+ink-jet time") the additional quantities of fluid 121a and 121b have evaporated. No additional fluid is deposited with the final droplet 120c. Thus, at the end of the printing time (i.e. "t=0+ink-jet time") each of the droplets 120a", 120b' and 120c are of substantially the same size since only the additional fluid 121a and 121b has evaporated (in contrast to the prior arrangement illustrated in FIG. 5 above).

While the droplets represented in FIG. 9 comprise two separate droplets (e.g. 120a and 121a), as will be described below, the droplet may in fact be printed as a single droplet (having a variable volume) comprising both the droplet and the additional quantity of fluid. Furthermore, it will be appreciated that FIG. 9 is merely schematic and in practice, even where the additional fluid is dispensed separately the droplets would combine on the substrate.

Thus, it will be appreciated that by carefully choosing the amount of variation in volume of imprintable medium deposited it is possible to arrange that all the droplets are of substantially equal size at the end of the printing process (i.e. after the earliest deposited droplets have evaporated for the time required of the printing process).

In an embodiment of the invention, the variation in volume of droplets may be achieved by dispensing a variable volume of imprintable medium onto the substrate as the print head(s) pass from one side of the substrate (or target region thereof) to the other. For example, the volume of the droplets being ejected may be decreased as the print head(s) move across the substrate (or target region thereof). The volume deposited may, for example, be gradually decreased as the print head(s) move across the substrate, for example the volume may be changed in small steps from one droplet to the adjacent deposited droplet. In an embodiment, the volume of droplets may, for example, be varied as a function of the time since the start of the printing process. In an embodiment, the volume of droplets may, for example, be varied as a function of the distance travelled by the print head relative to the target area. The volume of imprintable medium may, for example, be decreased in an inverse linear relationship to the distance travelled across the substrate or the time since the start of the printing process.

Figure 10:
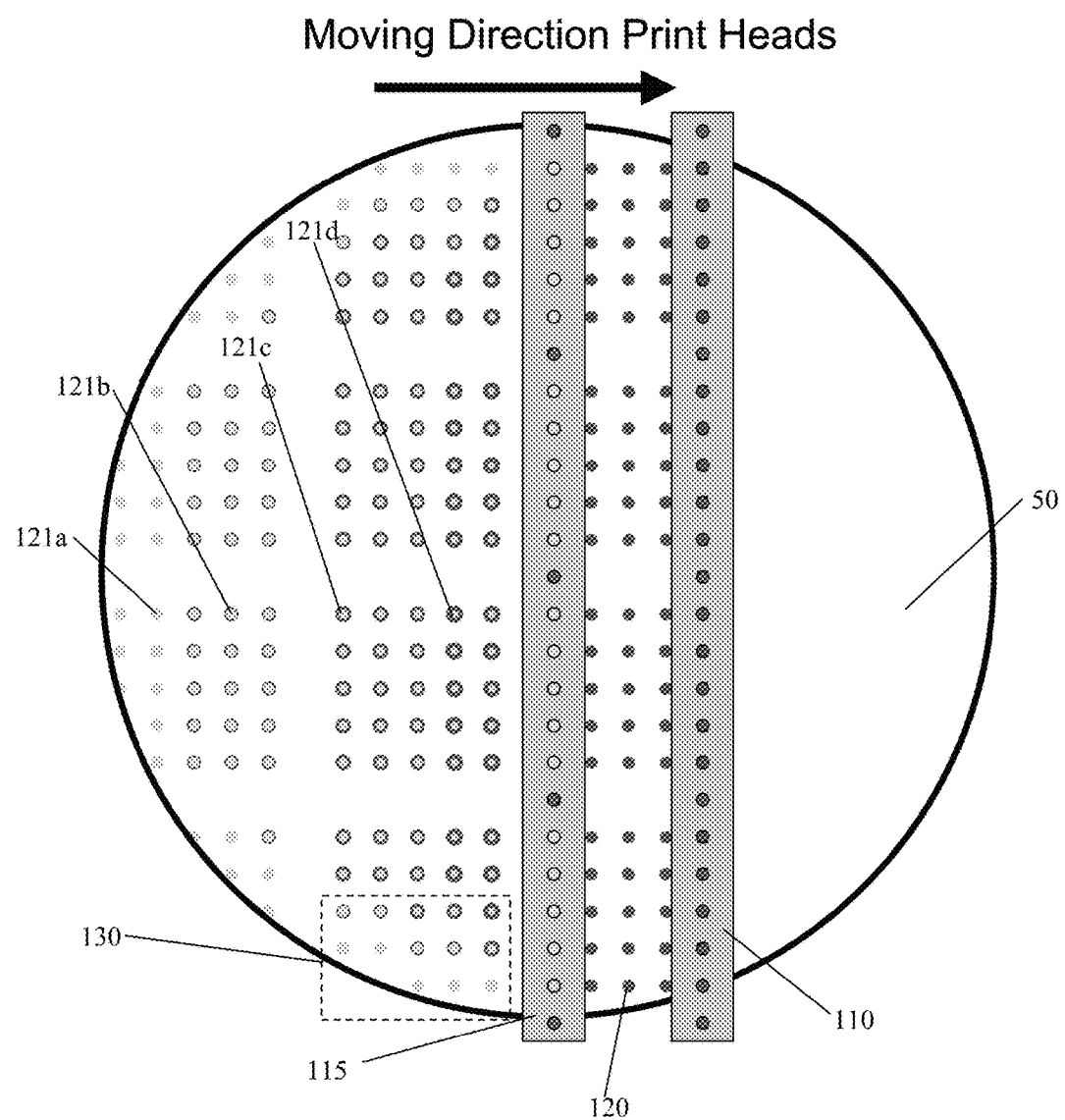
FIG. 10 schematically illustrates the printing of an imprintable medium on a substrate in accordance with an embodiment of the invention.

As shown in FIG. 10, the fluid dispenser according to an embodiment of the invention may comprise at least two print heads 110, 115 (or two arrays of multiple print heads). The first print head(s) 110 may be arranged to eject a first series of uniform droplets 120 (i.e., droplets having substantially constant volume) of liquid imprintable medium onto the substrate 50. The second print head(s) 115 may be arranged to eject an additional series of droplets 121 of fluid of variable volume to compensate for evaporation of the first series 120. The additional droplets 121 may, for example, be arranged to vary the volume of the total droplet at a given location as discussed above (for example varying with respect to time or distance across the target area). Since the first deposited droplets of liquid imprintable medium 120 are able to evaporate for the longest period of time, the second print head(s) 115 may, for example, be arranged to deposit a series of droplets of decreasing volume of fluid 121a-121d as the print head(s) 115 is moved from one side of the print area of the substrate 50 to the other.

To reduce or minimize the printing time (and therefore increase substrate throughput) the first 110 and second 115 print heads may scan across the substrate simultaneously. For example the second print head 115 may be spaced a fixed distance apart from the first print head 110. The first 110 and second 115 print heads may, for example, be provided at fixed generally aligned locations and the substrate may be moved relative to both the print heads 110, 115 to provide the scanning action during printing. The print heads 110, 115 may, for example, extend substantially parallel to one another in a direction substantially perpendicular to the relative movement across the substrate as shown in FIG. 10.

The volume of the fluid deposited by the second print head 115 may, for example, be relatively small in comparison to the amount of fluid deposited by the first print head 110. Depositing a small volume with the second print head 115 may enable more accurate control of the volume of fluid being deposited. For example, the droplets deposited by the first print head 110 may have a volume in the range of 1 to 50 pL (or even less than one pL) and the droplets deposited by the second print head 115 may be varied within the range of 0 to 50 pL.

The second print head 115 may, for example, be arranged to eject liquid imprintable medium. Alternatively the second print head 115 may, for example, be arranged to eject fluid which comprises only one or more constituents of the liquid imprintable medium. For example, the fluid may comprise an additive as discussed above, for example the liquid may be a solvent.

Evaporation is more pronounced around the edge regions of the substrate 50. This effect is due to the droplet deposited at the edge of a substrate being exposed to more ambient gas than those deposited in the center of the substrate (such that evaporation in the central regions may be considered to occur only in a direction perpendicular to the substrate). Therefore, in an embodiment as shown in FIG. 10, the second print head 115 may be arranged to deposit a greater volume of fluid in a region 130 at or adjacent to the edge of the substrate. The print head may, for example, be arranged to deposit a decreasing volume of fluid from the edge of the substrate to a region towards the center of the substrate (for example a region spaced in which the droplets are substantially surrounded by other droplets). The volume of the droplets deposited may, for example, be varied with respect to the distance from the edge of the substrate, for example as a function of the distance from the edge. As shown in FIG. 10, it will be appreciated that the volume of the droplets may be varied to compensate for the variation of evaporation rates due to both the edge effects and the time delay during deposition across the substrate.

The embodiments of the invention described above in relation to FIGS. 6 to 10 may use any suitable imprintable medium. They are not intended to be limited to imprintable medium which includes an evaporation buffer. However, the term "imprintable medium" is not intended to be limited to a composition consisting purely of imprintable medium. For example, the imprintable medium ejected by the dispenser may in some embodiments comprise a composition of imprintable medium and one or more other compounds. The composition may, for example, comprise imprintable medium and an additive, or evaporation buffer, (for example a solvent) as discussed above.

While specific examples of the invention have been described above, it will be appreciated that the present invention may be practiced otherwise than as described. The description is not intended to limit the invention.

The invention claimed is:

1. A method of depositing an imprintable medium onto a target area of a substrate for imprint lithography, the method comprising:

moving the substrate, a print head comprising a nozzle to eject an imprintable medium onto the substrate, or both, relative to the other in a first direction across the target area while ejecting a first series of droplets of imprintable medium onto the substrate across the target area; and moving the substrate, the print head, or both, relative to the other in a second direction, which is opposite the first direction, across the target area while ejecting a second series of droplets of imprintable medium onto the substrate across the target area on or adjacent to droplets from the first series of droplets, wherein the speed of the relative movement of the print head, the substrate, or both, in the second direction is substantially equal to the speed of the relative movement of the print head, the substrate, or both, in the first direction.

2. A method of depositing an imprintable material onto a target area of a substrate, the method comprising:

moving the substrate, a print head comprising a nozzle to eject imprintable material onto the substrate, or both, relative to the other such that a location of the print head relative to the target area moves from a first side of the target area to a second side of the target area, while the print head ejects a series of droplets of imprintable material onto the substrate; and decreasing a volume of the droplets being ejected as the location of the print head relative to the target area moves from the first side of the target area to the second side of the target area.

3. The method of claim 2, comprising:

moving a first print head, the substrate, or both, relative to the other such that a location of the first print head relative to the target area moves from a first side of the target area to a second side of the target area, while the first print head ejects a first series of droplets of substantially constant volume onto the substrate;

moving a second print head, the substrate, or both, relative to the other such that a location of the second print head relative to the target area moves from a first side of the target area to a second side of the target area, while the second print head ejects a second series of droplets of liquid onto the substrate such that each droplet in the second series is deposited on or adjacent to a droplet from the first series; and decreasing the volume of the droplets being ejected in the second series as the location of the second print head relative to the target area moves from the first side of the target area to the second side of the target area.

4. An imprint lithography method comprising:

moving the substrate, a first print head comprising a nozzle to eject imprintable material onto the substrate, or both, relative to the other while ejecting a first series of droplets of imprintable material onto a target area;

moving the substrate, a second print head comprising a nozzle to eject imprintable material onto the substrate, or both, relative to the other while ejecting a second series of droplets onto the target area on or adjacent to droplets from the first series;

varying a volume of the individual droplets being ejected in the second series, and increasing a volume of the droplets being ejected in the second series at locations proximal to the edge of the substrate.

5. The method of claim 4, wherein the second series comprises droplets of imprintable material.

6. The method of claim 4, wherein the second series comprises droplets of solvent.

7. The method of claim 4, wherein the location of the first and second print heads relative to the target area move generally simultaneously from a first side of the target area to a second side of the target area.

8. A method of depositing an imprintable medium onto a target area of a substrate for imprint lithography, the method comprising:

moving the substrate, a print head comprising a nozzle to eject an imprintable medium onto the substrate, or both, relative to the other in a first direction across the target area while ejecting a first series of droplets of imprintable medium onto the substrate across the target area; and moving the substrate, the print head, or both, relative to the other in a second direction, which is opposite the first direction, across the target area while ejecting a second series of droplets of imprintable medium onto the substrate across the target area on or adjacent to droplets from the first series of droplets, wherein the second series of droplets are deposited on the first series of droplets.

* * * * *